United States Patent [19]
Iino et al.

[11] Patent Number: 5,108,985
[45] Date of Patent: Apr. 28, 1992

[54] BI-PB-SR-CA-CU OXIDE SUPERCONDUCTOR CONTAINING ALKALI METAL AND PROCESS FOR PREPARATION THEREOF

[75] Inventors: Yuji Iino; Yoshinori Matsunaga; Saburo Nagano; Hiromi Imura, all of Kokubu, Japan

[73] Assignee: Kyocera Corporation, Kyoto, Japan

[21] Appl. No.: 600,194

[22] Filed: Oct. 17, 1990

[30] Foreign Application Priority Data

Nov. 27, 1989 [JP] Japan .................................. 1-308618
Dec. 25, 1989 [JP] Japan .................................. 1-335596
May 25, 1990 [JP] Japan .................................. 2-136581
May 25, 1990 [JP] Japan .................................. 2-136582

[51] Int. Cl.$^5$ .......................................... H01L 39/12
[52] U.S. Cl. ......................................... 505/1; 505/739; 505/782; 252/518; 252/521
[58] Field of Search ................... 252/518, 521; 505/1, 505/739, 782

[56] References Cited
FOREIGN PATENT DOCUMENTS 0336621 10/1989 European Pat. Off. .

OTHER PUBLICATIONS

Ramakrishna et al., "Synthesis, Properties and Microstructure of the-100k Bi(Pb)-Sr-Ca-Cu Oxide Superconductor", *Physica C*, vol. 158, 1987, pp. 203-210.

Ashizawa et al., "Variation of Composition in a Bi(Pb)-Sr-Ca-Cu-O Grarn and the Influence of Mg and Ba Doping on Its Superconductivity", *JJAP* vol. 28, No. 7, Jul. 1989 pp. L1140-L1143.

*Primary Examiner*—Paul Lieberman
*Assistant Examiner*—Bradley A. Swope
*Attorney, Agent, or Firm*—Spensley Horn Jubas & Lubitz

[57] ABSTRACT

Disclosed is a process for the preparation of a composite metal oxide superconductor, in which a composite metal oxide composition comprising Bi, Pb, Sr, Ca and Cu and further containing an alkali metal at a specific ratio is used as the starting material, and this composite metal oxide composition is molded and fired. According to this process, precipitation of the 80 K phase and other impurities is controlled, and a superconductor containing a large quantity of the 110 K phase and a high critical temperature is obtained.

11 Claims, 7 Drawing Sheets ns BI-PB-SR-CA-CU OXIDE SUPERCONDUCTOR CONTAINING ALKALI METAL AND PROCESS FOR PREPARATION THEREOF

BACKGROUND OF THE INVENTION (1) Field of the Invention

The present invention relates to an oxide superconductor of the Bi—Sr—Ca—Cu—O type having a high critical temperature (Tc) and a high critical current density (Jc).

(2) Description of the Related Art

Metal type superconductors represented by NbTi and Nb$_3$Sn are now used as the superconductor. The critical temperature Tc (the temperature at which the material becomes superconductive) of these superconductors is about 20 K. Recently, a composite oxide comprising a transition metal, an alkaline earth element and copper, which shows a superconductive phenomenon above 77 K., is reported in Physical Review Letters, 58 (1978), pages 908–910, and in case of this composite oxide, the superconductive phenomenon can be attained at a temperature of liquid nitrogen, and cheap liquid nitrogen can be used instead of expensive liquid helium. Therefore, the application range of the superconductor tends to expand.

Investigations have been made so as to further elevate the critical temperature Tc in these oxide superconductors, and a superconductor of the Bi—Sr—Ca—Cu—O type having a critical temperature of 110 K. or 80 K., recently proposed in Jap. J. Appli. Letters, 27 (1988), L209, attracts attention.

However, in the case where the above-mentioned superconductor of the Bi—Sr—Ca—Cu—O type is prepared as a sintered body (bulk body), the phase of the critical temperature Tc of 110 K. and the phase of the critical temperature of 80 K. are present in the mingled state in the sintered body, and the 80 K. phase acts as an impurity, and therefore, it is impossible to elevate Tc of the sintered body.

Incidentally, these known 110 K. and 80 K. phases are composed of $Bi_2Sr_2Ca_2Cu_3O_{10+\delta}$ and $Bi_2Sr_2Ca_1Cu_2O_{8+\delta'}$ respectively.

As regards the technique of forming a sintered body composed solely of the 110 K. phase, it is reported in Takano et al., Jap. J. Appl. Phys., 127, 6 (1988), L1041 to L1043 that the content of the 110 K. phase can be increased by addition of Pb. However, if Pb is added, stable $Ca_2PbO_4$ is formed in the grain boundary, and the superconductive characteristics, especially the critical current density (Jc), are lowered.

As the means for overcoming the defect of the system proposed by Takano et al., that is, a low critical current density (Jc), Tanaka et al., propose a process in which a uniaxial pressing step is added during the firing [Jap. Appl. Phys., 27, 9 (1988), L1655 and L1656], and it is taught that the Jc value can be increased according to this process.

However, even if this process is adopted, the Jc value is about 700 A/cm$^2$ at 0 Oe (Oersted), and with increase of the intensity of the magnetic field, the Jc value is drastically reduced and the Jc value is as small as about 200 A/cm$^2$ at 100 Oe.

SUMMARY OF THE INVENTION

It is a primary object of the present invention to overcome the foregoing defects of the conventional techniques and to provide an oxide superconductor of the Bi—Sr—Ca—Cu—O type having a high 110 K. phase content, a high critical temperature (Tc) and a high critical current density (Jc) and a process for the preparation thereof.

Another object of the present invention is to provide an oxide superconductor in which the variation of the critical current density according to the change of the intensity of the magnetic field is small.

We made research with a view to overcoming the defects of the conventional techniques and as the result, it was found that if Pb and an alkali metal component are added to an oxide superconductor of the Bi—Sr—Ca—Cu—O type having a specific composition, an oxide superconductor having excellent characteristics can be obtained. We have now completed the present invention based on this finding.

More specifically, in accordance with the present invention, there is provided a process for the preparation of a composite metal oxide superconductor comprising Bi, Pb, Sr, Ca and Cu as constituent elements, which comprises molding a composite metal oxide composition comprising metal oxides at such a metal molar ratio that supposing that the mole number of Sr is 2, the mole number of Bi is 1.8 to 2.2, the mole number of Pb is 0.1 to 0.6, the mole number of Ca is 2.0 to 3.5 and the mole number of Cu is 3.0 to 4.5, said composite metal oxide composition further comprising at least one alkali metal component selected from the group consisting of K, Na and Li in an amount of 0.01 to 0.5 mole per 2 moles of Sr, and firing the molded body.

Furthermore, in accordance with the present invention, there is provided a process for the preparation of a composite metal oxide superconductor, which comprises molding a composite metal oxide composition comprising Bi, Pb, Sr, Ca and Cu and at least one alkali metal component selected from the group consisting of K, Na and Li as constituent elements and containing a compound represented by the formula of $CuBi_2O_4$ in an amount of 5 to 42% by weight based on the entire composition, and firing the molded body.

Moreover, in accordance with the present invention, there is provided a process for the preparation of a composite metal oxide superconductor comprising Bi, Pb, Sr, Ca and Cu as constituent elements, which comprises calcining a composite metal oxide composition comprising metal oxides at such a metal molar ratio that supposing that the mole number of Sr is 2, the mole number of Bi is 1.8 to 2.2, the mole number of Pb is 0.1 to 0.6, the mole number of Ca is 2.0 to 3.5 and the mole number of Cu is 3.0 to 4.5 and further comprising at least one alkali metal component selected from the group consisting of K, Na and Li in an amount of 0.01 to 0.5 mole per 2 mole of Sr, pulverizing the calcination product to form a powder of a composite metal oxide containing a compound represented by the formula of $CuBi_2O_4$ in an amount of 5 to 42% by weight based on the total oxide, molding the powder of the composite metal oxide, and firing the molded body.

Superconductors of the present invention prepared according to the above-mentioned processes consist essentially of a sintered body of a composite metal oxide comprising Bi, Pb, Sr, Ca, Cu and at least one alkali metal selected from the group consisting of K, Na and Li, wherein said metals are contained at such a metal molar ratio that supposing that the mole number of Sr is 2, the mole number of Bi is 1.8 to 2.2, the mole number of Ph is 0.1 to 0.5, the mole number of Ca is 2.0 to 3.5, the mole number of Cu is 3.0 to 4.5 and the mole number of the alkali metal is larger than 0 but up to 0.1, and wherein the critical temperature (Tc) is higher than 100 K.

DETAILED DESCRIPTION OF THE INVENTION

Starting Materials

Figure 1:
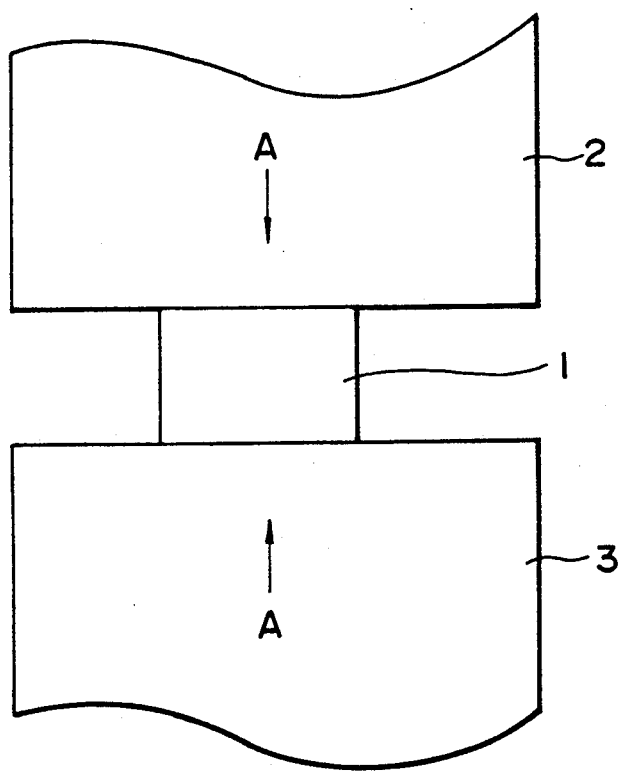
FIGS. 1 and 2 are diagrams illustrating the hot forging treatment.

In the process for the preparation of a composite metal oxide superconductor according to the present invention, a composite metal oxide composition comprising Bi, Pb, Sr, Ca, Cu and an alkali metal component as constituent elements is used as the starting material. The alkali metal component is at least one element selected from the group consisting of K, Na and Li.

As pointed out hereinbefore, an effect of promoting the formation of the 110 K. phase is attained by addition of Pb, but if Pb is added, $Ca_2PbO_4$ is formed as an impurity to degrade the characteristics of the obtained superconductor. According to the present invention, by using the composite metal oxide composition containing the alkali metal component as the starting material, the firing temperature can be lowered and the reaction of converting a superconductor of the 80 K. phase to a superconductor of the 110 K. phase, which is represented by the following formula:

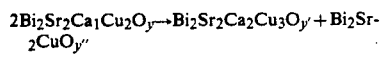

can be promoted, and the formation of $Ca_2PbO_4$ can be controlled and influences of intergranular precipitates in the sintered body can be moderated.

In order to obtain an excellent superconductor having a high 110 K. phase content, it is preferred that the starting composite metal oxide composition should contain metal oxides at such a metal molar ratio that supposing that the mole number of Sr is 2, the mole number of Bi is 1.8 to 2.2, especially 1.9 to 2.0, the mole number of Pb is 0.1 to 0.6, especially 0.2 to 0.5, the number of Ca is 2.0 to 3.5, especially 3.1 to 3.2, the mole number of Cu is 3.0 to 4.5, especially 4.1 to 4.3, and the mole number of the alkali metal is 0.01 to 0.5, especially 0.05 to 0.4. If the amount of any of Bi, Ca and Cu is too small and is below the above-mentioned range, a large quantity of the 80 K. phase is left, and if the amount of any one of the foregoing metal is too large and exceeds the above-mentioned range, an impurity phase is formed and in an extreme case, a superconductive phase is not formed.

If the mole number of Pb is smaller than 0.1, the sintering speed is reduced and the amount of the formed 110 K. phase is decreased. If the mole number of Pb exceeds 0.6, an impurity such as $Ca_2PbO_4$ is formed and the critical temperature (Tc) and the critical current density (Jc) are reduced.

If the mole number of the alkali metal is smaller than 0.01, the firing temperature becomes high and the amount of $Ca_2PbO_4$ is therefore increased and it is impossible to increase the amount formed of the 110 K. phase. If the mole number of the alkali metal exceeds 0.5, the amount of the normally conductive phase in the grain boundary increases and Tc is lowered.

The composite metal oxide composition is used in the form of a mixed powder of oxides of metals or compounds of metals capable of being converted to oxides by firing, such as carbonates, or in the form of a calcined powder obtained by calcining the above-mentioned mixed powder at a temperature of 780° to 810° C. The alkali metal can also be used in the form of a fluoride, a chloride, a bromide or an iodide.

In the present invention, by including a compound represented by the formula of $CuBi_2O_4$ in the above-mentioned composite metal oxide composition, crystallization of the 110 K. phase is promoted and formation of $Ca_2PbO_4$ is controlled. Preferably, the content of $CuBi_2O_4$ is adjusted to 5 to 42% by weight.

As the means for including this compound into the composite metal oxide composition, there can be adopted a method in which CuO is reacted with $Bi_2O_3$ by calcination or the like to synthesize $CuBi_2O_4$ and the compound is mixed with other metal elements in the form of oxides or the like. Furthermore, there can be adopted a method in which a mixed powder formed by mixing oxides, carbonates or the like of Bi, Pb, Sr, Ca and Cu is calcined, for example, at a temperature of 700° to 850° C., and the calcined powder is sufficiently mixed with an alkali metal compound in the presence of water to form $CuBi_2O_4$ in the metal oxide composition. According to this method, the above-mentioned metal compounds are reacted by the calcination to form not only the 80 K. phase represented by $Bi_2Sr_2CaCu_2O_{8+\delta}$ but also $Ca_2PbO_4$ and CuO. This 80 K. phase is decomposed by the alkali metal, such as K, Na or Li, dissociated in the presence of water, to form $CuBi_2O_4$. The amount formed of $CuBi_2O_4$ depends greatly on the amount added of the alkali metal compound, and the content of $CuBi_2O_4$ can be controlled within the above-mentioned range by appropriately adjusting the amount added of the alkali metal compound.

The above-mentioned $CuBi_2O_4$ is a compound having a melting point of 855° C., which is very close to the synthesis temperature of the 110 K. phase. Accordingly, it is considered that when firing is carried out at a temperature of 820° to 850° C. described below, the reaction of this $CuBi_2O_4$ with other components is effectively carried out, and the synthesis of the 110 K. phase represented by the formula of $Bi_2Sr_2Ca_2Cu_3O_{10+\delta}$ from $CuBi_2O_4$ is promoted.

Molding Step

In the preparation process of the present invention, the powder of the above-mentioned composite metal oxide composition is molded into a desired shape. This molding is accomplished, for example, by press molding, doctor blade molding, extrusion molding or injection molding, or there can be adopted a method in which the powder is charged in a silver pipe and is then rolled.

Firing Step

According to the present invention, the obtained molded body is fired. This firing is carried out at a temperature of 820° to 850° C., especially 835° to 845° C., in an oxidative atmosphere in which oxygen can be sufficiently supplied, for example, in open air. If the firing temperature is lower than 820° C., synthesis of the 110 K. phase is difficult, and if the firing temperature is higher than 850° C., $CaPbO_4$ is precipitated or the crystal phase is dissolved out and decomposed. Preferably, the retention time at this firing temperature is at least 100 hours. If the retention time is shorter than 100 hours, formation of the 110 K. phase is insufficient and the 80 K. phase is apt to be present.

By this firing, a flaky crystal of the low-critical-temperature phase is once formed, and as firing is advanced, the conversion of the low-critical-temperature phase (80 K. phase) to the high-critical-temperature phase (110 K. phase) is effected.

Furthermore, by this firing, Pb in the starting composition is solid-dissolved in the superconductive phase and is caused to occupy the Bi site by substitution, but the alkali metal atom such as Na, K or Li is not solid-dissolved in the superconductive phase but is present in the grain boundary. If this alkali metal atom is left in the final sintered body, this alkali metal atom has bad influences on the superconductive characteristics. Accordingly, it is necessary to volatilize the alkali metal atom during the firing. This volatilization can be easily accomplished by adjusting the firing time.

Pressing Step

In the present invention, the above-mentioned firing is carried out in a plurality of stages and the sintered body is pressed during this firing. By this operation, the density of the sintered body can be increased and the c-axis orientation of grains can be enhanced, and the critical current density of the superconductor can be highly improved.

This pressing is accomplished by once firing the above-mentioned molded body at a temperature of 820° to 850° C., cooling the obtained sintered body and subjecting the sintered body to cold monoaxial pressing or cold static pressure pressing under a pressure of at least 100 kg/cm², especially at least 500 kg/cm².

Figure 2:
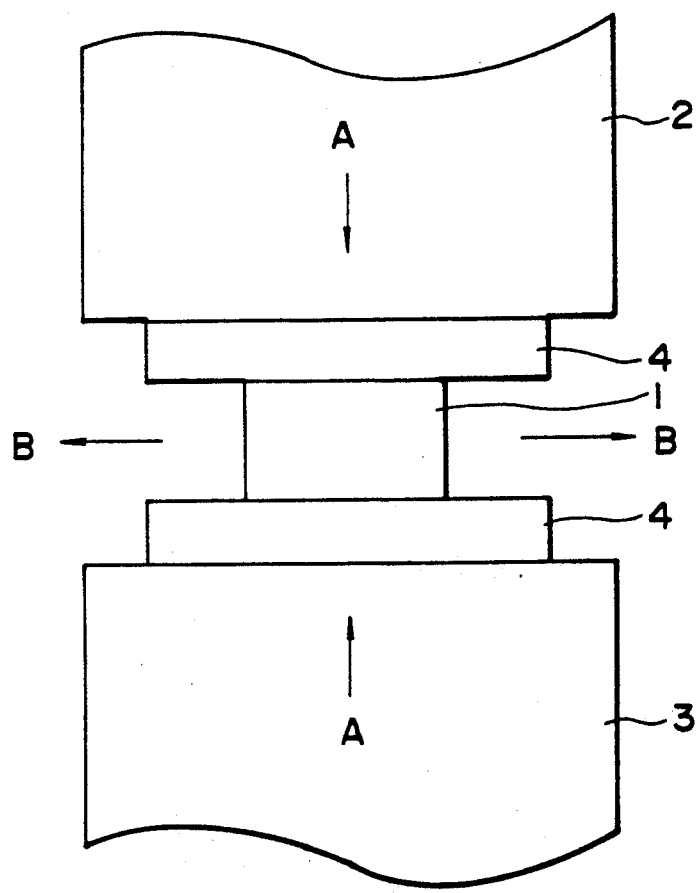

Furthermore, the pressing can be accomplished by adopting a heating condition of 800° to 850° C. for the pressing instead of the above-mentioned cold pressing condition. In this case, the pressing pressure is preferably higher than 50 kg/cm². The pressing under the heating condition is preferably carried out in an oxidative atmosphere such as open air. Moreover, the so-called hot forging treatment or the hot forging treatment using a ductile metal plate is preferably adopted for effecting the above-mentioned pressing. The forging treatment is accomplished by pressing a sintered body 1 from above and below by press punches 2 and 3 while heating the sintered body 1 by appropriate heating means (not shown), as shown in FIG. 1. This hot forging treatment is different from the hot pressing treatment in that an open state is maintained in a direction orthogonal to the direction of pressing the sintered body 1. The hot forging treatment using a ductile metal plate is accomplished, for example, by inserting ductile metal plates 4 between a sintered body 1 and a press punch 2 and between the sintered body 1 and a press punch 3, respectively, as shown in FIG. 2. A ductile metal plate composed of silver, platinum, gold or copper, which has a thickness of at least 0.05 mm, especially 0.1 to 2 mm, is preferably used. By using this ductile metal plate, the ductile metal plate per se is rolled in direction B by the pressure applied in direction A in FIG. 2, and simultaneously, the sintered body 1 is rolled in direction B. Accordingly, flaky crystal grains in the sintered body are oriented in direction B and compacted, whereby the density of the sintered body is increased. Moreover, since the adhesion among flaky crystal grains is drastically increased by the increase of the density of the sintered body, the critical current density of the obtained oxide superconductor is further elevated. This effect can be enhanced by repeating the above-mentioned hot forging treatment several times.

In the present invention, if the above pressing operation is conducted only once, growth of the grains is caused at the second firing after the pressing, the grains are liable to crumble again and reduction of the density is sometimes caused. Accordingly, the pressing-firing operation is preferably repeated at least two times, whereby the orientation of the grains is promoted and a superconductor having a high critical current density can be obtained.

Especially when the above-mentioned hot forging treatment is carried out, the oxide superconductor of the high-critical-temperature phase formed by the firing is partially decomposed and the low-critical-temperature phase is formed in the grain boundary, and the critical current density is reduced by the action of this decomposition product. Accordingly, if the firing is repeated after the hot forging treatment, the high-critical-temperature phase is formed again from the formed decomposition product by the peritectic reaction, with the result that the quantities of impurities in the grain boundary are reduced and the texture is uniformalized.

In the case where the firing-pressing operation is repeated, it is preferred that the total firing time be adjusted over 100 hours, as pointed out hereinbefore.

Oxide Superconductor

According to the present invention, by adjusting the volatilzation amount of Pb or the alkali metal by controlling the firing time and the like, there can be obtained an oxide superconductor having a composition where supposing that the mole number of Sr is 2, the mole number of Bi is 1.8 to 2.2, especially 1.9 to 2.1, the mole number of Pb is 0.1 to 0.5, especially 0.4 to 0.5, the mole number of Ca is 2.0 to 3.5, especially 3.0 to 3.1, the mole number of Cu is 3.0 to 4.5, especially 4.0 to 4.2, and the mole number of the alkali metal is up to 0.1, especially 0.001 to 0.008.

As is apparent from the examples given hereinafter, in the oxide superconductor of the present invention, formatin of impurities such as the 80K phase and $Ca_2PbO_4$ is controlled, and the oxide superconductor has a high critical temperature (Tc) exceeding 100K.

By the above-mentioned pressing operation, an oxide superconductor having a density corresponding to at least 50%, especially at least 60%, of the theoretical density, a c-axis-oriented texture and a high critical current density (Jc) even in a magnetic field can be obtained. For example, the critical current density at 77K of the oxide superconductor in a magnetic field of 100 Oe is higher than 500 A/cm².

As is apparent from the foregoing description, according to the present invention, by incorporating an alkali metal such as Na, Li or K into a superconductor of the Bi-Pb-Sr-Ca-Cu-O type, precipitation of the 80K phase and other impurities is controlled, and an oxide superconductor containing a large amount of the 110K phase and having a high critical temperature can be obtained. Changes of characteristics caused according to changes of the magnetic field are very small in this superconductor. Therefore, the oxide superconductor of the present invention can be used effectively and advantageously as magnetic shielding materials, various electronic parts and the like.

The present invention will now be described in detail with reference to the following examples that by no means limit the scope of the invention.

EXAMPLE 1

Powders of $Bi_2O_3$, PbO, $SrCO_3$, $CaCO_3$ and CuO as the starting powders were weighed and mixed so that metal molar ratios shown in Table 1 were attained, and the mixed powders were calcined at 750° to 810° C. for 20 hours and the calcination product was pulverized to obtain a calcined powder having an average particle size of 5 μm. Then, $K_2CO_3$ was added to the calcined powder in such an amount that a molar ratio shown in Table 1 was attained, and they were mixed in a mortar and a disk-shaped sample having a thickness of about 1 mm was prepared under a molding pressure of 1 ton/cm² by using a mold having a diameter of 12 mm.

The obtained sample was fired under firing conditions shown in Table 1.

With respect to the obtained sintered body, the specific gravity was determined according to the Archimedes method, the crytical temperature (Tc) was determined based on the change of the electric resistance, and from the results of the measurement of the A.C magnetic susceptibility, the volume fraction of the superconductor at 90K was determined. The obtained results are shown in Table 1.

The volume fraction of the superconductor was determined in the following manner.

The sample was placed in a coil of 1 KHz under an effective voltage of 0.16 V, and the volume fraction of the superconductor was calculated according to the following formula:

$$\text{volume fraction of superconductor } \% = \frac{\Delta H_2}{\Delta H_1} \times 100$$

wherein $\Delta H_2$ represents the change of the magnetic susceptibility at 90°K in the Bi-type sample (measurement sample) and $\Delta H_1$ represents the change of the magnetic susceptibility at 4.2K in Pb (standard sample).

TABLE 1

| Sample No. | Composition Formula | | | | | | Firing Condition | | Composition of Sintered Body | | | | | | Specific Gravity | Tc (°K.) | Volume Fraction of SC |
|---|---|---|---|---|---|---|---|---|---|---|---|---|---|---|---|---|---|
| | Bi | Pb | Sr | Ca | Cu | K | temperature (°C.) | time (h) | Bi | Pb | Sr | Ca | Cu | K | | | |
| 1* | 1.93 | 0.36 | 2 | 3.17 | 4.25 | — | 850 | 200 | 1.88 | 0.42 | 2 | 3.19 | 4.16 | 0 | 2.43 | 89 | 30 |
| 2 | 1.93 | 0.36 | 2 | 3.17 | 4.25 | 0.36 | 840 | 200 | 2.00 | 0.45 | 2 | 3.07 | 4.13 | 0.007 | 2.14 | 107 | 80 |
| 3* | 1.93 | 0.36 | 2 | 3.17 | 4.25 | 0.70 | 830 | 200 | 2.04 | 0.55 | 2 | 3.25 | 4.19 | 0.24 | 2.54 | 70 | 25 |
| 4* | 1.93 | 0.36 | 2 | 3.17 | 4.25 | 1.05 | 820 | 200 | 1.94 | 0.55 | 2 | 3.34 | 4.33 | 0.55 | 2.64 | 65 | 10 |
| 5* | 1.0 | 0.36 | 2 | 3.17 | 4.25 | 0.36 | 840 | 200 | 1.01 | 0.55 | 2 | 3.30 | 4.30 | 0.006 | 3.5 | not found | — |
| 6* | 1.93 | 0.05 | 2 | 3.17 | 4.25 | 0.36 | 840 | 200 | 1.95 | 0.06 | 2 | 3.29 | 4.35 | 0.003 | 3.2 | 75 | 20 |
| 7 | 1.93 | 0.36 | 2 | 2.0 | 3.0 | 0.36 | 840 | 200 | 1.95 | 0.46 | 2 | 2.03 | 3.05 | 0.005 | 2.5 | 101 | 35 |

Note
*outside the scope of the present invention

Figure 3:
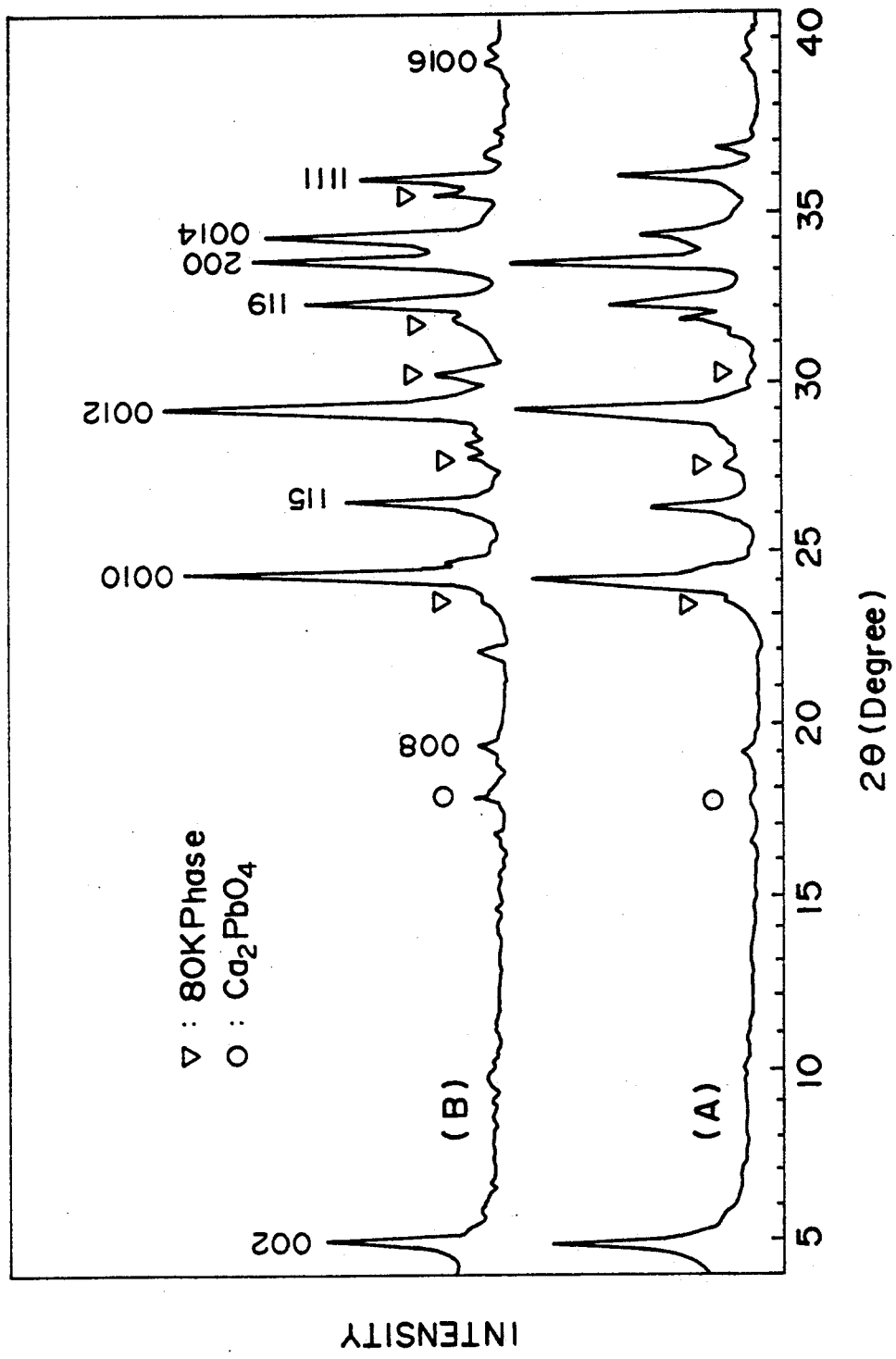
FIG. 3 is an X-ray diffraction chart diagram of the product of the present invention and the comparative product, prepared in Example 1.

With respect to sample 1 in Table 1 and sample 2 where K was not added, the X-ray diffraction charts were determined, and the results are shown in FIG. 3. From FIG. 3, it is understood that in case of the K-free product (B), peaks of the 80K phase and $Ca_2PbO_4$ are observed, but in the product (A) of the present invention, the peaks of the 80K phase and $Ca_2PbO_4$ are diminished.

With respect to the same samples as shown in FIG. 3, the temperature/resistance relation and temperature/volume fraction of the susceptibility relation were determined. The results obtained in the product (A) of the present invention are shown in FIG. 4 and the results obtained in the conventional product (B) are shown in FIG. 5.

Figure 4:
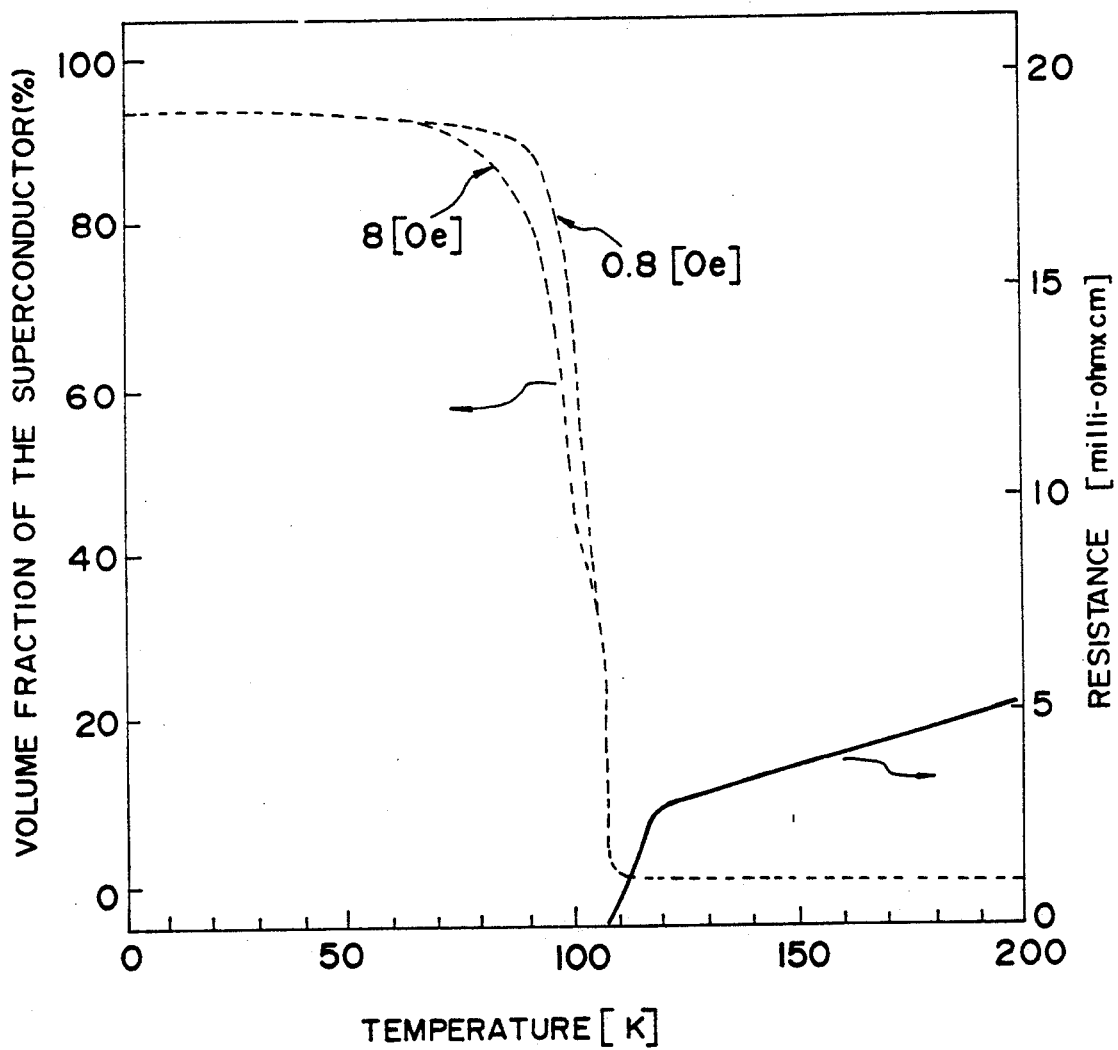
FIGS. 4 and 5 are diagrams illustrating the temperature/resistivity relation and temperature/volume fraction of the superconductor in the product of the present invention and the comparative product, obtained in Example 1.
Figure 5:
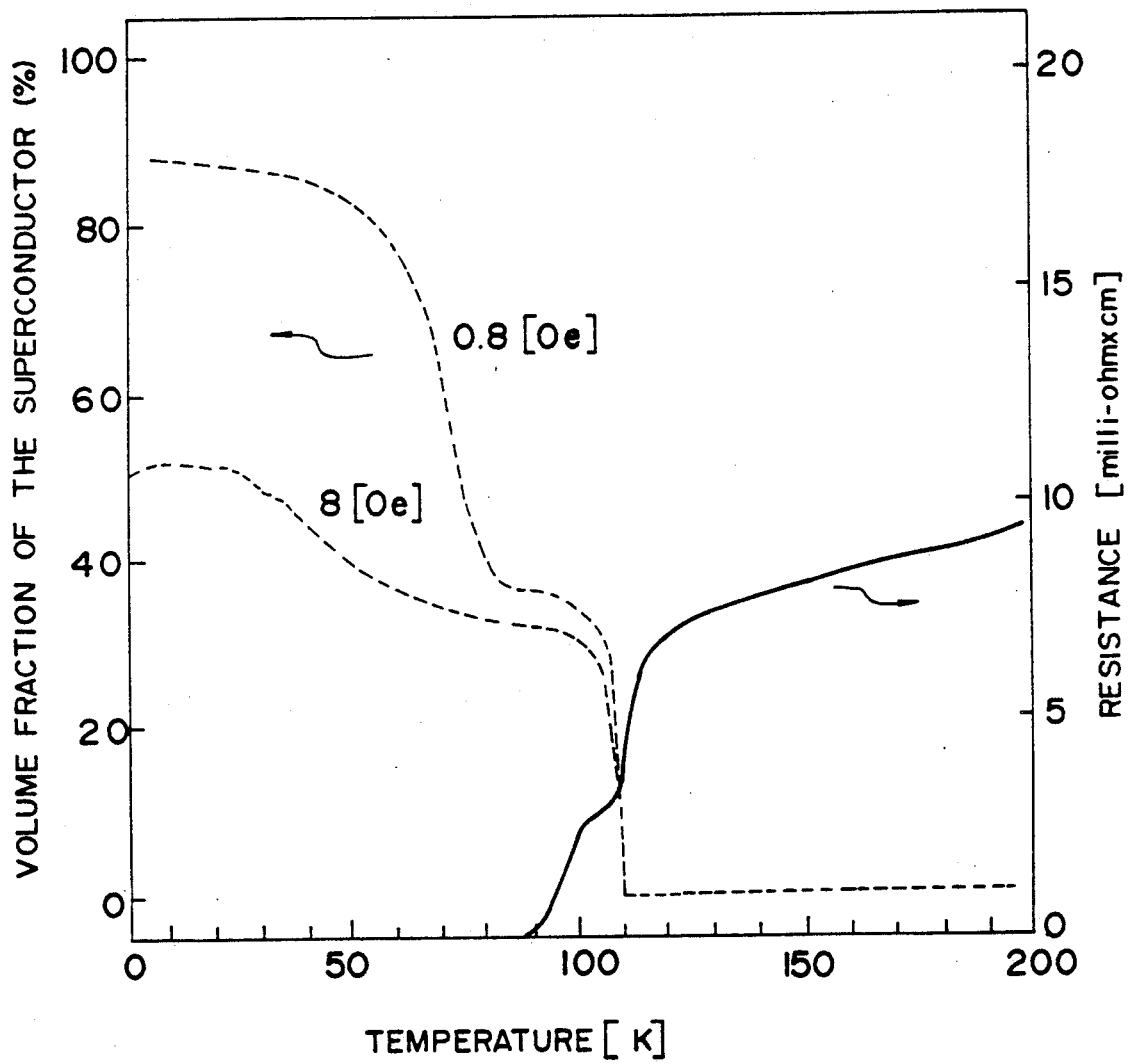

When FIG. 4 is compared with FIG. 5, it is understood that in the temperature/resistance curve of FIG. 5, the onset temperature (Tco) is present in the vicinity of 110K but a step is formed in the intermediate portion and the offset temperature (Tce) is 89K. Namely, it can be confirmed that although the 110K phase is contained, different phases such as the 80K phase are formed. Furthermore, from the temperature/volume fraction of the susceptibility curve of FIG. 5, it is understood that the volume fraction of the susceptibility is as high as about 88% at 0.8 Oe in liquid helium at 4.2K but the volume fraction of the susceptibility is about 52% at 8 Oe, and the volume fraction of the susceptibility is greatly changed according to the temperature.

In contrast, in the product of the present invention shown in FIG. 4, in the temperature/resistance curve, the resistance value in the vicinity of 200K is as small as about 5 mΩ, the onset temperature (Tco) appears in the vicinity of 120K, a step as shown in FIG. 5 is not formed, the resistance value is monotonously decreased, the offset temperature (Tce) is as high as 107K, and different phases such as the 80K phase are not substantially formed. Moreover, from the temperature/volume fraction of the susceptibility curve in FIG. 4, it is seen that such a high volume fraction of the susceptibility as about 94% is attained at 4.2K, the volume fraction of the superconductor is hardly changed even in a magnetic field of 8 Oe, and the magnetic field dependency is very small.

EXAMPLE 2

A disk-shaped sample was prepared in the same manner as described in Example 1 except that $Na_2CO_3$ or $Li_2CO_3$ was added so that the molar ratio shown in Table 2 was attained, and the firing was carried out under conditions shown in Table 2.

With respect to the obtained sintered body, the volume fraction of the superconductor at 90K was determined in the same manner as described in Example 1. The obtained results are shown in Table 2.

TABLE 2

| Sample No. | Composition Formula | | | | | | | Firing Conditions | | Composition of Sintered Body | | | | | | | Specific Gravity | Tc (°K.) | Volume Fraction of SC |
|---|---|---|---|---|---|---|---|---|---|---|---|---|---|---|---|---|---|---|---|
| | Bi | Pb | Sr | Ca | Cu | Na | Li | temperature (°C.) | time (hr) | Bi | Pb | Sr | Ca | Cu | Na | Li | | | |
| 1* | 1.93 | 0.36 | 2 | 3.17 | 4.25 | — | — | 850 | 200 | 1.88 | 0.42 | 2 | 3.19 | 4.16 | — | — | 2.43 | 89 | 90 |
| 2 | 1.93 | 0.36 | 2 | 3.17 | 4.25 | 0.07 | — | 840 | 200 | 1.97 | 0.45 | 2 | 3.09 | 4.15 | 0.005 | — | 1.99 | 107 | 94 |
| 3 | 1.93 | 0.36 | 2 | 3.17 | 4.25 | 0.36 | — | 830 | 200 | 1.98 | 0.43 | 2 | 3.12 | 4.09 | 0.007 | — | 2.15 | 106 | 88 |
| 4* | 1.93 | 0.36 | 2 | 3.17 | 4.25 | 0.70 | — | 820 | 200 | 2.00 | 0.42 | 2 | 3.13 | 4.12 | 0.19 | — | 2.61 | 74 | 18 |
| 5* | 1.0 | 0.36 | 2 | 3.17 | 4.25 | 0.07 | — | 840 | 200 | 1.03 | 0.39 | 2 | 3.31 | 4.22 | 0.005 | — | 3.82 | not found | 2 |
| 6* | 1.93 | 0.05 | 2 | 3.17 | 4.25 | 0.07 | — | 840 | 200 | 1.98 | 0.07 | 2 | 3.11 | 4.38 | 0.008 | — | 3.62 | 68 | 14 |
| 7 | 1.93 | 0.36 | 2 | 2.0 | 3.0 | 0.07 | — | 840 | 200 | 1.94 | 0.44 | 2 | 2.02 | 3.03 | 0.004 | — | 2.71 | 102 | 62 |
| 8 | 1.93 | 0.36 | 2 | 3.17 | 4.25 | — | 0.07 | 840 | 200 | 1.92 | 0.41 | 2 | 3.20 | 4.19 | — | 0.009 | 2.12 | 107 | 90 |
| 9 | 1.93 | 0.36 | 2 | 3.17 | 4.25 | — | 0.36 | 830 | 200 | 1.87 | 0.38 | 2 | 3.19 | 4.28 | — | 0.008 | 2.32 | 105 | 81 |
| 10* | 1.93 | 0.36 | 2 | 3.17 | 4.25 | — | 0.70 | 820 | 200 | 1.95 | 0.39 | 2 | 3.22 | 4.26 | — | 0.022 | 3.31 | 79 | 25 |
| 11 | 1.93 | 0.36 | 2 | 3.17 | 4.25 | 0.04 | 0.03 | 840 | 200 | 1.93 | 0.43 | 2 | 3.18 | 4.22 | 0.001 | 0.001 | 2.01 | 107 | 91 |
| 12 | 1.93 | 0.36 | 2 | 3.17 | 4.25 | 0.27 | 0.09 | 830 | 200 | 1.89 | 0.44 | 2 | 3.25 | 4.27 | 0.011 | 0.004 | 2.27 | 104 | 67 |
| 13* | 1.93 | 0.36 | 2 | 3.17 | 4.25 | 0.50 | 0.20 | 820 | 200 | 1.92 | 0.38 | 2 | 3.21 | 4.29 | 0.019 | 0.009 | 3.52 | 81 | 28 |

Note
*outside the scope of the present invention

As shown in Table 2, in each of samples 4, 10 and 13 where the amount added of Na or Li was larger than 0.5 mole per 2 moles of Sr, the amount of the alkali metal left in the final sintered body was very large and a high critical temperature was not manifested. Furthermore, sample 5 where the amount of Bi was too small did not show any substantial superconductivity. Moreover, when the amount of Pb was small, the critical temperature was low and the volume fraction of the superconductive phase was low.

In contrast, each of the samples of the present invention had a critical temperature higher than 100K and the volume fraction of the superconductive phase was higher than 80%.

EXAMPLE 3

Powders of $Bi_2O_3$, $SrCO_3$, $CaCO_3$, CuO and PbO were mixed so that the molar ratio represented by the formula of $Bi_{1.93}Pb_{0.35}Sr_{2.0}Ca_{3.17}Cu_{4.25}O_y$ was attained and the mixture was calcined in open air at 800° C. for 16 hours by using an alumina mortar. The calcination product was pulverized in the alumina mortar, and a powder of $K_2CO_3$ was added to the pulverized powder in an amount of 0.36 mole per 2 moles of Sr and they were mixed in the mortar.

The mixed powder was molded under a molding pressure of 1000 kg/cm² into a disk-shaped molded body having a thickness of 1 mm by using a mold having a diameter of 12 mm.

The molded body was fired according to one of three firing patterns shown in Table 3.

TABLE 3

Firing Pattern 1  845° C.
   250 hrs 2  840° C., 100 hrs → 500 Kg/cm² pressing → 840° C., 50 hrs 3  840° C., 100 hrs → 1000 Kg/cm² pressing → 840° C., 50 hrs →

TABLE 3-continued

Firing Pattern

1000 Kg/cm² pressing → 845° C., 50 hrs → 1000 Kg/cm² pressing → 845° C., 50 hrs

X-ray diffraction patterns of the final sintered bodies obtained according to the firing patterns shown in Table 3 were determined. The obtained results are shown in FIG. 6.

Figure 6:
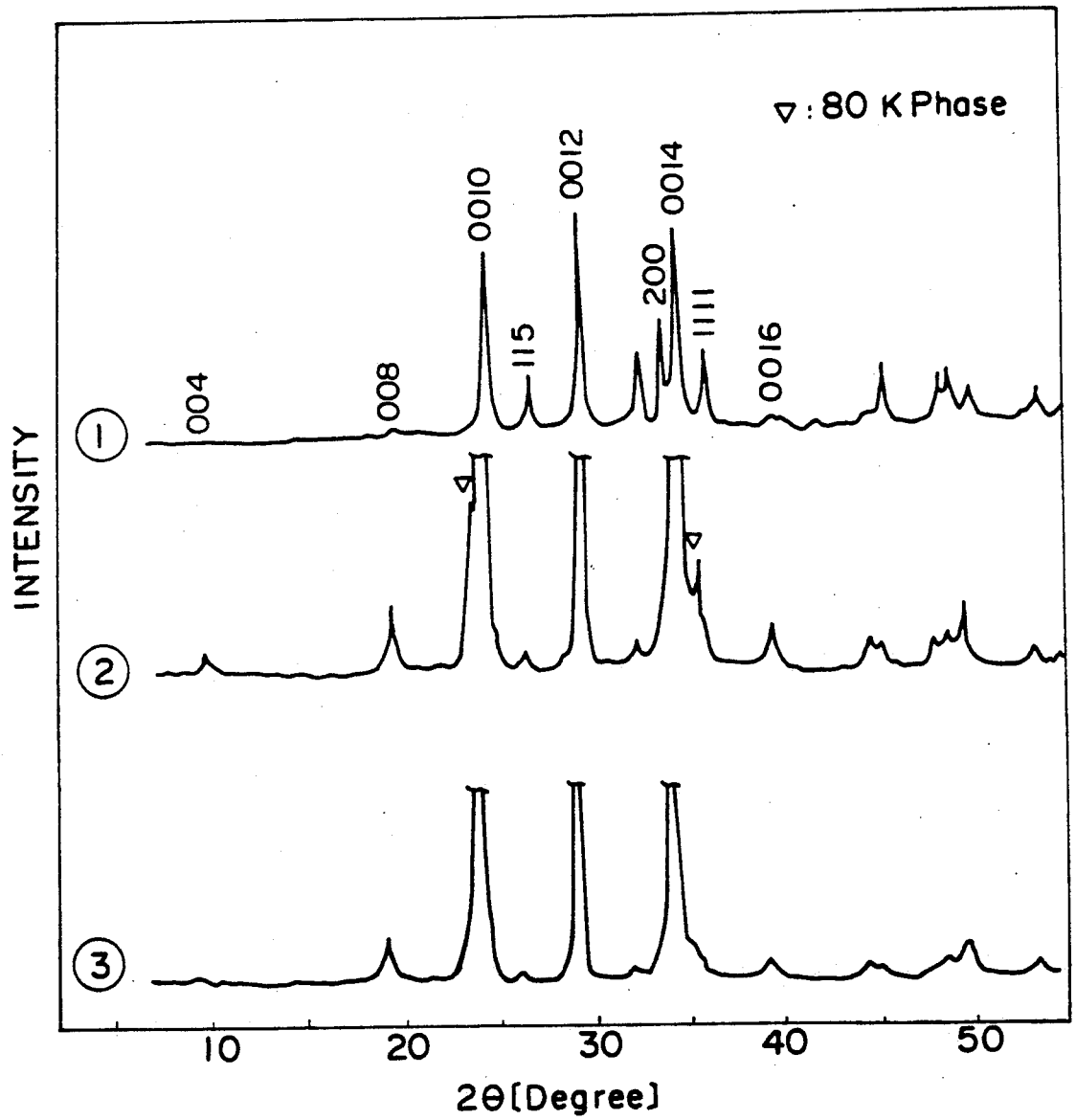
FIG. 6 is an X-ray diffraction chart diagram of the sintered bodies obtained in Example 3.

From the results shown in FIG. 6, it is seen that in the pressureless state, various crystal peaks are observed, and if the pressing operation is carried out, the chart becomes monotonous and the peak on the (00 l) plane is conspicuous and if the pressing operation is repeated, only the peak on the (00 l) plane is present and no substantial peak of the 80° K. phase is found.

With respect to the obtained superconductor, the critical current density (Jc) was measured in the state immersed in liquid nitrogen by the 4-terminal method while changing the intensity of the magnetic field in the range of from 0 to 400 Oe. The relation between the intensity of the magnetic field and the critical current density, observed with respect to each sample, is plotted in FIG. 7.

Figure 7:
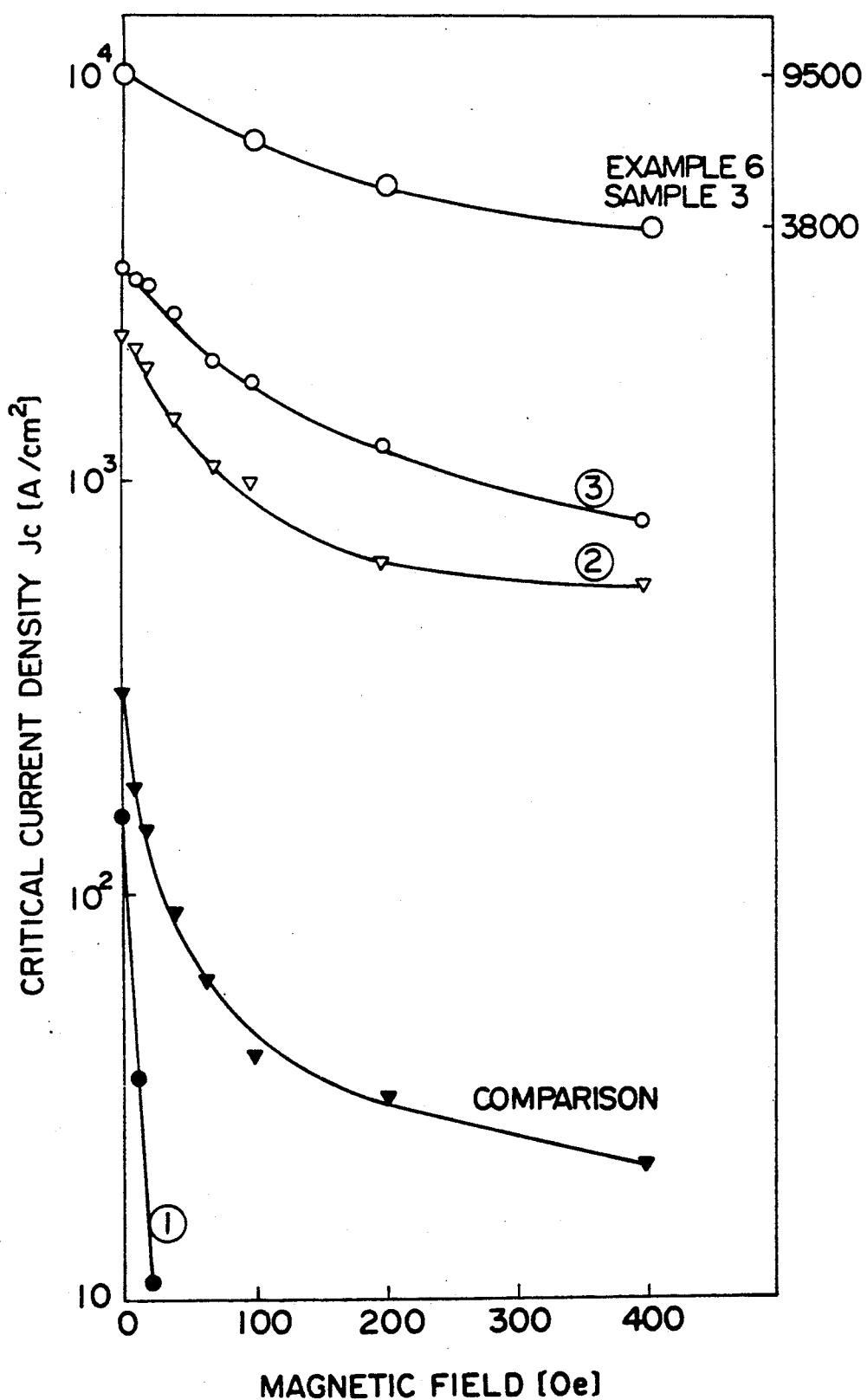
FIG. 7 is a diagram illustrating the relation between the intensity of the magnetic field and the critical current density in the sintered bodies obtained in Example 3.

In FIG. 7, the results obtained with respect to the comparative molded article having the same composition as described above except that K was not added, which was fired according to the firing pattern ② shown in Table 3, are similarly plotted in FIG. 7.

From the results shown in FIG. 7, it is understood that in the comparative sample fired under the firing conditions ① and the K-free comparative sample, the critical current density is about 200 A/cm² at highest, but in contrast, in each of the samples of the present invention fired according to the firing pattern ② and ③, the Jc value is as large as 1000 A/cm² in a magnetic field of 0 Oe and the Jc value is as large as 500 A/cm² even in a magnetic field of 100 Oe.

EXAMPLE 4

Seven disk-shaped samples were prepared in the same manner as described in Example 1, and these samples were fired according to the firing pattern ② shown in Table 3.

With respect to each of the obtained sintered bodies, the molar ratios of the metal elements were calculated by the ICP analysis, and the specific gravity was determined by the Archimedes method and the relative density based on the theoretical density was calculated. Furthermore, the critical temperature (Tc) was determined from the change of the electric resistance, and the volume fraction of the superconductor at 90 K. was determined from the results of the measurement of the A.C magnetic susceptibility. Moreover, the critical current density Jc (in a magnetic field of 100 Oe) at 77 K. was measured according to the four-terminal method. For comparison, the cristal current density (in a magnetic field of 0 Oe) of the sintered body obtained by firing the molded body having the same composition as described above according to the firing pattern ① shown in FIG. 3 was measured.

The obtained results are shown in Table 4.

shaped sample having a thickness of about 1 mm by using a mold having a diameter of 12 mm.

With respect to the obtained molded body, the amount of $CuBi_2O_4$ was determined based on the calibration line from the peak intensity of the X-ray diffraction curve.

Then, the molded body was fired under conditions shown in Table 5.

With respect to the obtained sintered body, the specific gravity was determined according to the Archimedes method, the critical temperature (Tc) and critical current density (Jc) were determined from the change of the electric resistance, and the volume fraction of the superconductor at 90 K. was determined from the results of the measurement of the A.C magnetic susceptibility.

TABLE 4

| Sample No. | Composition Formula | | | | | | Composition of Sintered Body | | | | | | Ratio (%) to Theoretical Density | Tc (°K.) | Volume Fraction of SC | Critical Current density | |
|---|---|---|---|---|---|---|---|---|---|---|---|---|---|---|---|---|---|
| | | | | | | | | | | | | | | | | firing pattern 1 (comparison) | firing pattern 2 (present invention) |
| | Bi | Pb | Sr | Ca | Cu | K | Bi | Pb | Sr | Ca | Cu | K | | | | | |
| 1* | 1.93 | 0.36 | 2 | 3.17 | 4.25 | — | 1.87 | 0.43 | 2 | 3.20 | 4.15 | 0 | 60 | 89 | 30 | 80 | 46 |
| 2 | 1.93 | 0.36 | 2 | 3.17 | 4.25 | 0.36 | 2.01 | 0.46 | 2 | 3.05 | 4.15 | 0.007 | 63 | 107 | 80 | 150 | 920 |
| 3* | 1.93 | 0.36 | 2 | 3.17 | 4.25 | 0.70 | 2.20 | 0.55 | 2 | 3.25 | 4.20 | 0.23 | 58 | 80 | 25 | 30 | 300 |
| 4* | 1.93 | 0.36 | 2 | 3.17 | 4.25 | 1.05 | 1.94 | 0.54 | 2 | 3.35 | 4.33 | 0.005 | 53 | 65 | 10 | 10 | 150 |
| 5* | 1.0 | 0.36 | 2 | 3.17 | 4.25 | 0.36 | 1.0 | 0.56 | 2 | 3.30 | 4.30 | 0.006 | 48 | not found | — | — | — |
| 6* | 1.93 | 0.05 | 2 | 3.17 | 4.25 | 0.36 | 1.95 | 0.06 | 2 | 3.30 | 4.35 | 0.003 | 48 | 75 | 20 | — | — |
| 7 | 1.93 | 0.36 | 2 | 2.0 | 3.0 | 0.36 | 1.96 | 0.46 | 2 | 2.04 | 3.05 | 0.005 | 61 | 101 | 35 | 70 | 550 |

Note
*outside the scope of the present invention

The obtained results are shown in Table 5.

TABLE 5

| Sample No. | Composition (atomic ratios) of Molded Body | | | | | | Amount (% by weight) of $CuBi_2O_4$ in Molded Body | Firing Conditions | | Specific Gravity | Tc (°K.) | JC (A/cm$^2$) | Volume Fraction of SC |
|---|---|---|---|---|---|---|---|---|---|---|---|---|---|
| | Bi | Pb | Sr | Ca | Cu | K,Na,Li | | temperature (°C.) | time (hours) | | | | |
| 1* | 1.93 | 0.96 | 2 | 3.17 | 4.25 | — | 0 | 850 | 200 | 2.49 | 89 | 270 | 30 |
| 2 | 1.93 | 0.96 | 2 | 3.17 | 4.25 | K = 0.09 | 16 | 845 | 200 | 2.10 | 100 | 1580 | 35 |
| 3 | 1.93 | 0.36 | 2 | 3.17 | 4.25 | K = 0.18 | 28 | 843 | 200 | 1.86 | 102 | 2700 | 70 |
| 4 | 1.93 | 0.36 | 2 | 3.17 | 4.25 | K = 0.36 | 40 | 840 | 200 | 1.68 | 105 | 3100 | 85 |
| 5 | 1.93 | 0.36 | 2 | 3.17 | 4.25 | Na = 0.09 | 15 | 840 | 200 | 2.35 | 92 | 1580 | 50 |
| 6 | 1.93 | 0.96 | 2 | 3.17 | 4.25 | Na = 0.18 | 38 | 835 | 200 | 2.00 | 99 | 2000 | 70 |
| 7 | 1.93 | 0.96 | 2 | 3.17 | 4.25 | Na = 0.96 | 41 | 830 | 200 | 2.10 | 105 | 2300 | 80 |
| 8 | 1.93 | 0.96 | 2 | 3.17 | 4.25 | Li = 0.09 | 15 | 840 | 200 | 2.18 | 93 | 1630 | 50 |
| 9 | 1.93 | 0.36 | 2 | 3.17 | 4.25 | Li = 0.18 | 36 | 830 | 200 | 2.00 | 100 | 1920 | 75 |
| 10 | 1.93 | 0.36 | 2 | 3.17 | 4.25 | K = 0.36 | 39 | 820 | 200 | 2.32 | 106 | 2400 | 85 |
| 11 | 1.93 | 0.36 | 2 | 3.17 | 3.95 | K = 0.36 | 32 | 840 | 200 | 2.40 | 105 | 1700 | 60 |
| 12 | 1.93 | 0.36 | 2 | 3.17 | 3.65 | K = 0.36 | 28 | 840 | 200 | 2.30 | 103 | 2100 | 75 |
| 13 | 1.93 | 0.96 | 2 | 2.82 | 4.25 | K = 0.36 | 40 | 840 | 200 | 2.80 | 105 | 1800 | 61 |

Note
*outside the scope of the present invention

EXAMPLE 5

Powders of $Bi_2O_3$, PbO, $SrCO_3$, $CaCO_3$, and CuO as the starting powders were weighed and mixed so that the metal molar ratios shown in Table 5 were attained. The powder mixture was calcined at 750° to 810° C. for 20 hours and pulverized to obtain a calcined powder having an average particle size of 5 μm. Then, $K_2CO_3$, $Na_2CO_3$ or $Li_2CO_3$ was added to the calcined powder in such an amount that the molar ratio shown in FIG. 5 was attained, and they were mixed in a mortar by using a solution comprising ethanol and water at a ratio of 5/1 as the dispersion medium. The mixture was molded under a molding pressure of 1 ton/cm$^2$ into a disk- As shown in Table 5, in sample 1 where K, Na or Li was not added, formation of $CuBi_2O_4$ was not observed, and after the firing, the Jc value was small and the volume fraction of the superconductor was low.

In contrast, in samples where K, Na or Li was added, formation of $CuBi_2O_4$ was observed, and the characteristics after the firing were much superior to those of sample 1. From the results shown in Table 5, it is understood that the characteristics are improved according to the amount formed of $CuBi_2O_4$ in the molded body.

EXAMPLE 6

Powders of $Bi_2O_3$, PbO, $SrCO_3$, $CaCO_3$, CuO and $K_2CO_3$ as the starting powders were weighed and mixed at a Bi/Pb/Sr/Ca/Cu/K molar ratio of 1.93/0.36/2/3.17/4.25/0.36. The powder mixture was calcined at 750° to 810° C. for 20 hours and pulverized to obtain a calcined powder having an average particle size of 5 μm and containing a large amount of the low Tc phase.

The calcined powder was molded under a molding pressure of 1 ton/cm² into a disk-shaped molded body having a thickness of about 1 mm by using a mold having a diameter of 12 mm.

The molded body was fired at 840° C. in open air for 150 hours to obtain a sintered body having a specific gravity of 2.0 (as determined by the Archimedes method). When the texture was observed, it was found that flaky crystal grains of the high Tc phase were randomly oriented.

According to the method shown in FIG. 1, the sintered body was subjected to the hot forging treatment at 820° C. while applying a pressure of 1 ton/cm² to both of the upper and lower surfaces of the sintered body.

Then, the sintered body was re-fired at 840° C. in open air for 500 hours to obtain a sintered body (sample 1).

A sintered body (sample 2) was prepared in the same manner as described above except that the re-firing operation was not carried out.

Furthermore, a sintered body (sample 3) was prepared in the same manner as described above except that after the hot forging treatment, the sample was once cooled to room temperature, the hot forging treatment was conducted again under the same conditions, the hot forging treatment was thus conducted three times finally and then, the re-firing was conducted in the same manner as described above.

A sintered body (sample 4) was prepared in the same manner as described above with respect to sample 3 except that the re-firing operation was not carried out after the hot forging treatment.

Furthermore, a sintered body (sample 5) was prepared by carrying out the hot forging treatment and the refiring operation in the same manner as described above with respect to sample 1 and repeating the hot forging treatment and re-firing operation under the same conditions three times.

With respect to each of the obtained samples, the specific gravity was determined by the Archimedes method, and the X-ray diffractometry was carried out and the orientation degree f of the (00 l) plane based on the chart data of the X-ray diffractometry from the following formula:

$$f=(P-Po)/(1-Po)$$

wherein:
P (oriented sample)=ΣI(00 l)/[ΣI(hkl)+ΣI(00 l)]
Po (unoriented sample)=ΣI'(00 l)/[ΣI'(hkl)+ΣI'(00 l)]

According to the resistance method, the sample of the sintered body was immersed in liquid nitrogen, the electric current applied was gradually increased, and the current value at which a voltage of 1 μV/cm was produced at a high voltage terminal was measured as the critical current density Jc. Simultaneously, the critical temperature Tc was measured.

The obtained results are shown in Table 6.

With respect to sample 3 shown in Table 6, the intensity of the magnetic field was changed in the range of from 0 to 400 Oe, and the dependency of the critical current density on the intensity of the magnetic field was examined. The obtained results are shown in FIG. 7.

TABLE 6

| Sample No. | Specific Gravity | Orientation Degree f | Jc (A/cm²) | Tc (K) |
|---|---|---|---|---|
| 1 | 5.8 | 0.80 | 6800 | 105 |
| *2 | 6.0 | 0.75 | 5500 | 104 |
| 3 | 5.9 | 0.85 | 9500 | 105 |
| *4 | 6.0 | 0.80 | 6300 | 104 |
| 5 | 6.0 | 0.85 | 10500 | 105 |

Note
*outside the scope of the present invention

As is apparent from the results shown in Table 6, especially from the comparison of sample 1 or 3 with sample 2 or 4, if the re-firing operation was carried out after the hot forging treatment, the orientation characteristics could be improved and the critical current density and critical temperature could be enhanced.

Furthermore, by repeating the hot forging treatment and the re-firing operation, the characteristics could be further improved.

As is apparent from the results shown in FIG. 7, the reduction of the critical current density by increase of the intensity of the magnetic field could be effectively controlled according to the present invention.

EXAMPLE 7

A sintered body prepared in the same manner as described in Example 6 was subjected to the hot forging treatment under a pressure of 1 ton/cm² at 820° C. by using a silver plate having a thickness of 0.1 mm according to the method shown in FIG. 2 to obtain a sintered body (sample 1).

A sintered body (sample 2) was prepared in the same manner as described above except that the silver plate was not used.

A sintered body (sample 3) was prepared by further subjecting sample 1 described above to the hot forging treatment using the silver plate two times.

A sintered body (sample 4) was prepared by firing sample 1 described above at 840° C. in open air, subjecting the fired sample to the monoaxial pressing treatment under a pressure of 5 ton/cm² at room temperature and heat-treating the sample at 840° C. for 5 hours in the pressureless state.

Sintered bodies (samples 5 and 6) were prepared by heat-treating samples 1 and 2 described above at 840° C. in open air in the pressureless state for 50 hours.

With respect to each of the obtained sintered bodies, the specific gravity, orientation degree, critical current density (Jc) and critical temperature (Tc) were determined in the same manner as described in Example 6.

The obtained results are shown in Table 7.

TABLE 7

| Sample No. | Specific Gravity | Orientation Degree f | Jc (A/cm²) | Tc (K) |
|---|---|---|---|---|
| 1 | 6.0 | 0.75 | 5500 | 104 |
| 2 | 5.9 | 0.50 | 4500 | 103 |
| 3 | 6.0 | 0.80 | 6500 | 104 |
| 4 | 4.8 | 0.50 | 1100 | 103 |
| 5 | 5.5 | 0.80 | 7800 | 105 |
| 6 | 5.7 | 0.85 | 12000 | 105 |

As is apparent from the results shown in Table 7, in the case (sample No. 2) where the hot forging treatment was carried out without using the ductile metal plates, the obtained characteristics were excellent over those obtained according to the conventional method (sample No. 4), but if the hot forging treatment was carried out by using the ductile metal plates, each of the specific gravity, orientation degree, Jc value and Tc value was further improved and if this hot forging treatment was repeated, the improving effect became conspicuous. Furthermore, if the heat treatment was carried out after the hot forging treatment, an oxide superconductor having a further enhanced critical current density could be obtained.

We claim:

1. A process for the preparation of a composite metal oxide superconductor comprising Bi, Pb, Sr, Ca and Cu as constituent elements, which comprises molding a composite metal oxide composition comprising metal oxides at a metal molar ratio where, for each 2 moles of Sr, the number of moles of Bi is 1.8 to 2.2, the number of moles of Pb is 0.1 to 0.6, the number of moles of Ca is 2.0 to 3.5 and the number of moles of Cu is 3.0 to 4.5, said composite metal oxide composition further comprising at least one alkali metal component selected from the group consisting of K, Na and Li in an amount of 0.01 to 0.5 mole per 2 moles of Sr, and firing the molded body.

2. A process according to claim 1, wherein the firing is carried out at a temperature of 820° to 850° C. in an oxygen-containing atmosphere.

3. A process according to claim 1, wherein the composite metal oxide composition comprises the metal oxides at a metal molar ratio where, for each 2 moles of Sr, the number of moles of Bi is 1.9 to 2.0, the number of moles of Pb is 0.2 to 0.5, the number of moles of Ca is 3.1 to 3.2 and the number of moles of Cu is 4.1 to 4.3 and the number of moles of the alkali metal is 0.05 to 0.4.

4. A process for the preparation of a composite metal oxide superconductor comprising Bi, Pb, Sr, Ca and Cu as constituent elements, which comprises calcining a composite metal oxide composition comprising metal oxides at a metal molar ratio where, for each 2 moles of Sr, the number of moles of Bi is 1.8 to 2.2, the number of moles of Pb is 0.1 to 0.6, the number of moles of Ca is 2.0 to 3.5 and the number of moles of Cu is 3.0 to 4.5 and further comprising at least one alkali metal component selected from the group consisting of K, Na and Li in an amount of 0.01 to 0.5 mole per 2 moles of Sr, pulverizing the calcination product to form a powder of a composite metal oxide containing a compound represented by the formula of $CuBi_2O_4$ in an amount of 5 to 42% by weight based on the total oxide, molding the powder of the composite metal oxide and firing the molded body.

5. A process according to claim 1 or 4, wherein the firing of the composite metal oxide composition molded body includes a first firing step and the second firing step, and a step of pressing the sintered body between the first firing step and the second firing step.

6. A process according to claim 5, wherein the sintered body is pressed under a pressure of at least 100 $kg/cm^2$ at the pressing step.

7. A process according to claim 5, wherein the sintered body is pressed under cold conditions at the pressing step.

8. A process according to claim 5, wherein the sintered body is pressed under a pressure of 50 $kg/cm^2$ at a temperature of 800° to 850° C.

9. A process according to claim 5, wherein the sintered body is pressed through a ductile metal plate.

10. A superconductor consisting essentially of a sintered body of a composite metal oxide comprising Bi, Pb, Sr, Ca, Cu and at least one alkali metal selected from the group consisting of K, Na and Li, at a metal molar ratio where, for each 2 moles of Sr, the number of moles of Bi is 1.8 to 2.2, the number of moles of Pb is 0.1 to 0.5, the number of moles of Ca is 2.0 to 3.5, the number of moles of Cu is 3.0 to 4.5 and the number of moles of alkali metal is larger than 0.001 but up to 0.01, and wherein the critical temperature (Tc) is higher than 100° K.

11. A superconductor as set forth in claim 10, wherein the critical current density (Jc) at 77 K in a magnetic field having an intensity of 100 Oe is at least 500 $A/cm^2$.

* * * * *